United States Patent [19]
Nguyen et al.

[11] Patent Number: 5,948,467
[45] Date of Patent: Sep. 7, 1999

[54] ENHANCED CVD COPPER ADHESION BY TWO-STEP DEPOSITION PROCESS

[75] Inventors: Tue Nguyen; Lawrence J. Charneski, both of Vancouver, Wash.; Masato Kobayashi, Teri, Japan

[73] Assignees: Sharp Laboratories of America, Inc., Camas, Wash.; Sharp Kabushiki Kaisha, Osaka, Japan

[21] Appl. No.: 09/122,346

[22] Filed: Jul. 24, 1998

[51] Int. Cl.⁶ ........................................ B05D 5/12
[52] U.S. Cl. .......................... 427/99; 427/124; 427/250; 427/255.7
[58] Field of Search ................................ 427/97, 99, 124, 427/255.7, 250, 253; 438/688, 687, 680, 681

[56] References Cited

PUBLICATIONS

N. Awaya et al., Evaluation of Copper Metallization Process and the Electrical Characteristics of Copper Interconnected Quarter–Micron CMOS, IEEE Trans. Electron Dev. 43 (1996) p.1206.

*Primary Examiner*—Brian K. Talbot
*Attorney, Agent, or Firm*—David C. Ripma; Gerald Maliszewski

[57] ABSTRACT

A method of enhancing copper adhesion to a substrate includes preparing a single-crystal silicon substrate; forming integrated circuit components on active areas of the substrate; metallizing the integrated circuit components, including metallizing a first copper layer by low-rate CVD, and metallizing a second copper layer by high-rate CVD; and finalizing construction of the structure.

10 Claims, 2 Drawing Sheets

5,948,467

ENHANCED CVD COPPER ADHESION BY TWO-STEP DEPOSITION PROCESS

FIELD OF THE INVENTION

This invention relates to the formation of integrated circuits, and specifically to the formation of an integrated circuit wherein the metallization process is performed by the chemical vapor deposition (CVD) of copper, wherein the copper has enhanced adhesive properties.

BACKGROUND OF THE INVENTION

Formation of integrated circuits requires that a metal substance be placed in contact with the active area of the integrated circuits so that the integrated circuit device may be connected to other such devices, or so that the integrated circuit may be connected to other components of an electromechanical system. It is generally desirable to use a metal material which is highly conductive. To this end, it is desirable to use copper.

Although the use of copper in an integrated circuit metallization process has some problems, it is desirable to use CVD copper as a high-performance metal film to replace aluminum and its alloys, which are currently the most commonly used metallization substances in integrated circuit construction. One of the most significant difficulties encountered with using copper for metallization has been the poor adhesion exhibited by copper when deposited by CVD. In some instances, a sputtered copper film has been laid down as a seed layer prior to the deposition of copper by CVD. N. Awaya et aL, Evaluation of Copper Metallization Process And The Electrical Characteristics Of Copper Interconnected Quarter-Micron CMOS, IEEE Trans. Electron Dev. 43 (1996) p.1206. This appears to promote adhesion of the copper to the underlying silicon-based structures. This is believed to occur because the sputtered copper is virtually pure copper and is deposited at a high kinetic energy, and forms a molecularly uniform layer of metal which forms a stronger bond with the underlying structure and which, therefore, exhibits better adhesion properties. The sputtering process, however, is costly, both in terms of time and equipment, and results in metal coverage in trenches and holes which is of poor quality.

Metal organic CVD has also been used to deposit a more uniform metal layer, as has providing some type of adhesion promoter on the substrate before the metallization step. For a variety of reasons, these procedures do not work well, with the main problem being that the copper separates from the underlying substrate.

SUMMARY OF THE INVENTION

A method of enhancing copper adhesion to a substrate includes preparing a single-crystal silicon substrate; forming integrated circuit components on active areas of the substrate; metallizing the integrated circuit components, including metallizing a first copper layer by low-rate CVD, and metallizing a second copper layer by high-rate CVD; and finalizing construction of the structure.

It is an object of the invention to provide an improved adhesion of CVD copper to an underlying substrate by a two-step deposition process.

Another object of the invention is to achieve a high throughput and a high deposition rate.

These and other objects and advantages of the invention will become more fully apparent as the description which follows is read in conjunction with the drawings.

DETAILED DESCRIPTION OF THE PREFERRED EMBODIMENT

As previously noted, it is an object of this invention to provide copper metallization to replace aluminum and its alloys, which are currently used in integrated circuit metallization. The poor adhesion quality of copper as deposited by chemical vapor deposition (CVD) techniques has has been overcome by the methods of the invention.

The method of the invention uses a two-step deposition process. The first step is a low-deposition rate process which is performed prior to the main deposition process. Through this two-step technique, the adhesion of copper to a barrier metal layer is significantly improved, and does not require that any other adhesion-promoting layer, such as sputtered copper, be used. The barrier metal layer is required to contain, or block, copper atoms which may contaminate the underlying silicon.

Although high deposition rates are desirable, due to savings in through-put time and wafer costs, a high deposition rate tends to degrade the adhesion to the barrier metal or underlying silicon-based layer. One cause for this degradation is believed to be the presence of organic solvents in the liquid copper precursor, which may react during CVD. The reaction tends to inhibit chemical bonding which is necessary for good adhesion. By performing a low-rate deposition step prior to the high-rate deposition step, sufficient time is believed to be allowed for the organic solvents within the precursor vapor to be carried out of the process vacuum chamber, instead of being captured within the film at the interface to the barrier metal, and interfering with the bonding and adhesion of the copper to the barrier metal.

In addition to the increased adhesion, the initial low-rate step allows for an improved electrical connection between the vertical layers of metal of the integrated circuit. This may result not only in improved device yields, but also in improved reliability, due to reduced joule heating and increased electro-migration lifetime, as compared to other metallization techniques.

Figure 1:
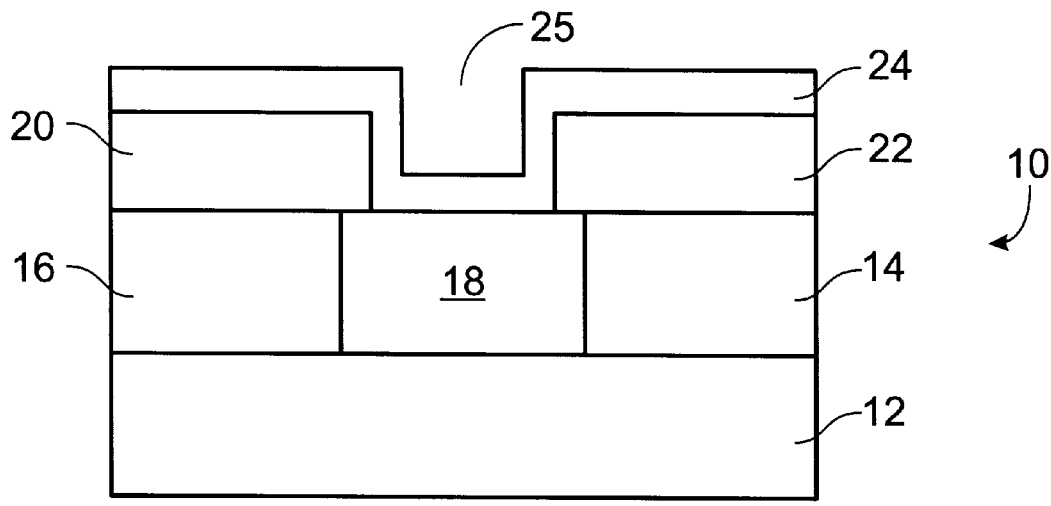
FIG. 1 is a frontal section of the device constructed according to the invention, before a low-rate CVD is carried out.
Figure 2:
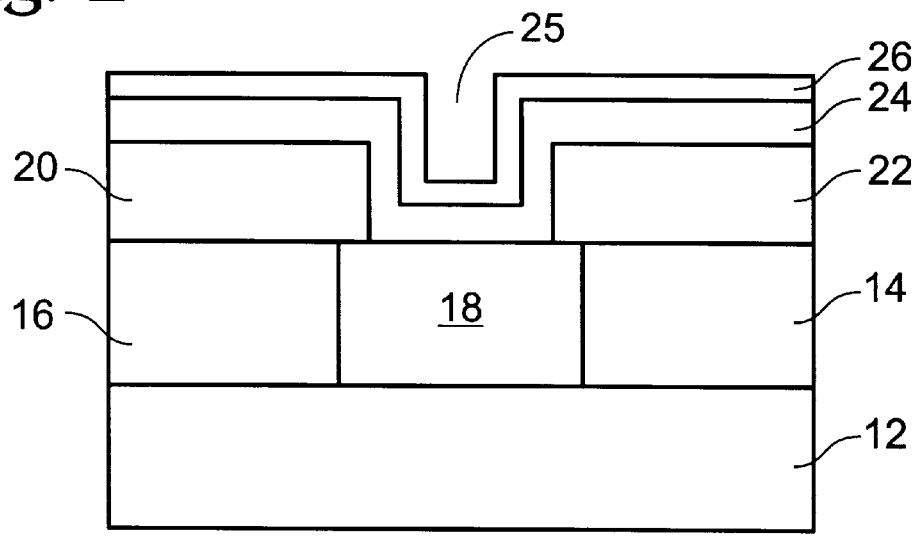
FIG. 2 depicts the device of the invention after a low-rate CVD.
Figure 3:
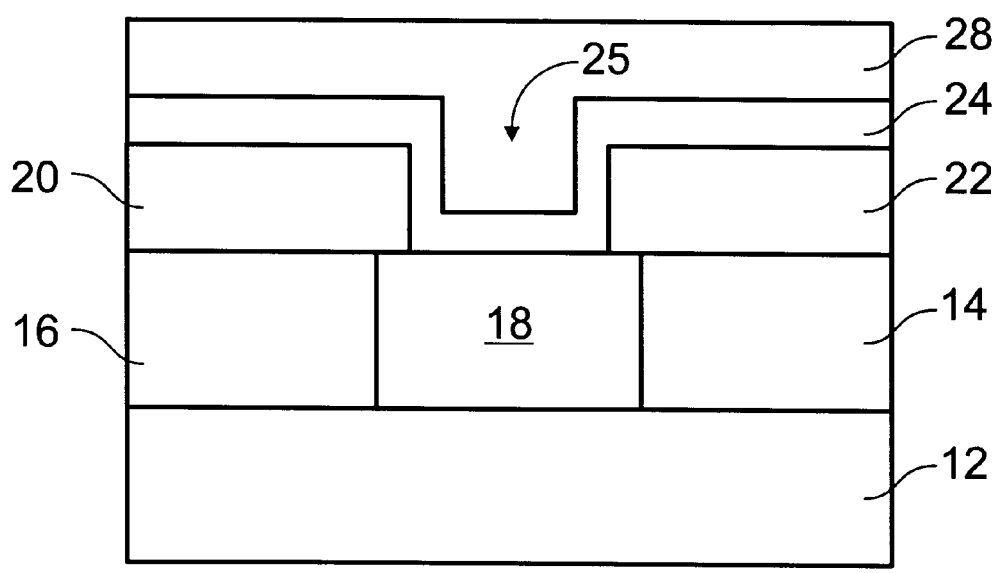
FIG. 3 depicts the device of the invention after a high-rate CVD.

Referring now to FIG. 1, construction of a integrated circuit according to the invention begins with forming a device area 10 on a single-crystal silicon substrate 12, or wafer. Oxide regions 14 and 16 surround a copper line 18, all of which are located on substrate 12. Additional oxide areas 20 and 22 are covered by a barrier metal 24, and surround a via hole 25.

The first step in the method of the invention includes the low-rate deposition of copper. This is done over a barrier metal. The deposition of copper begins in a vacuum chamber with a precursor, such as Schumacher's Cupra Select™ (copper hexafluoroacetonate trimethyl vinyl silane), having a liquid flow rate of 0.01 $cm^3$ $min^{-1}$ to 0.1 $cm^3$ $min^{-1}$, with a typical rate of 0.05 $cm^3$ $min^{-1}$. (It will be appreciated by those of skill in the art that the flow rates given herein are for substances in liquid form) This takes place for approximately 30 seconds, although the step may continue for a period of time of between 10 seconds and 120 seconds. This step may be performed during initial pressure stabilization after introduction of the wafer into the process vacuum chamber. The initial, or seed layer, of copper is typically between one nm and 100 nm thick following this step.

An alternative technique is to introduce the wafer immediately after the previous wafer processing cycle is completed, before the precursor residue from the previous deposition is pumped out of the process chamber, thereby exposing the wafer to the residual precursor for a few moments, specifically, between 30 seconds and three minutes, without the introduction of any additional copper precursor into the chamber.

The next step is the high-rate deposition of copper, having a precursor flow rate of 0.5 cm$^3$ min$^{-1}$ to 5 cm$^3$ min$^{-1}$, with 1.5 cm$^3$ min$^{-1}$ being a typical value. This continues until the copper is deposited into the desired thickness, which is typically 200 nm to 1,500 nm.

The typical copper deposition process chamber appears to have a "seasoning" effect which enhances the adhesive properties of the copper. That is, the first several wafers processed after any long (more than two hours) idle time will have poor adhesion. Subsequent wafers have improved adhesion, although occasional marginal adhesion occurs. Using the two-step deposition method of the invention, chamber idle time has no adverse effect on adhesion and good adhesion is assured for all wafers.

Although a preferred embodiment of practicing the method of the invention has been disclosed, it will be appreciated that further modifications and variations thereto may be made while keeping within the scope of the invention as defined in the appended claims.

We claim:

1. A method of enhancing copper adhesion to a substrate comprising:

preparing a single-crystal silicon substrate;

forming integrated circuit components on active areas of the substrate;

introducing the substrate into a CVD process chamber;

metallizing the integrated circuit components with CVD copper, including:

depositing copper in the chamber by CVD utilizing a liquid copper precursor having a liquid precursor flow rate of between about 0.01 cm$^3$ min$^{-1}$ to 0.1 cm$^3$ min$^{-1}$ to produce a first copper layer on the integrated circuit components, the first copper layer having a thickness of between about 1 nm to 100 nm, and after the first copper layer is formed, depositing copper in the chamber by CVD utilizing a liquid copper precursor having a liquid precursor flow rate of between about 0.5 cm$^3$ min$^{-1}$ to 5.0 cm$^3$ min$^{-1}$ to produce a second copper layer on the integrated circuit components, the second copper layer having a thickness of between about 200 nm to 1,500 nm, whereby the CVD copper adheres to the integrated circuit components.

2. The method of claim 1 wherein said step of depositing said first copper layer is performed for a period of time of between about 10 seconds and 120 seconds.

3. The method of claim 1 wherein said first copper layer is formed utilizing a liquid precursor having a flow rate of about 0.05 cm$^3$ min$^{-1}$ for about 30 seconds.

4. The method of claim 1 which includes the step of forming a barrier metal layer over the integrated circuit components prior to said metallizing steps, and said step of metallizing the integrated circuit components includes metallizing said barrier metal layer with CVD copper.

5. A method of enhancing copper adhesion to a substrate comprising:

preparing a single-crystal silicon substrate;

forming integrated circuit components on active areas of the substrate;

metallizing the integrated circuit components, including:

in a CVD process chamber, depositing copper in the chamber by CVD utilizing a liquid copper precursor having a liquid precursor flow rate of between about 0.01 cm$^3$ min$^{-1}$ to 0.1 cm$^3$ min$^{-1}$ for about 30 seconds to form a first copper seed layer on the integrated circuit components; and after the first copper seed layer is formed, depositing copper in the chamber by CVD utilizing a liquid copper precursor having a liquid precursor flow rate of between about 0.5 cm$^3$ min$^{-1}$ to 5.0 cm$^3$ min$^{-1}$ to form a second copper layer having a desired thickness on the integrated circuit components.

6. The method of claim 5 wherein said first copper layer has a thickness of between about 1 nm to 100 nm.

7. The method of claim 5 wherein said second copper layer has a thickness of between about 200 nm to 1,500 nm.

8. The method of claim 5 which includes the step of forming a barrier metal layer over the integrated circuit components prior to said metallizing steps, and said step of metallizing the integrated circuit components includes metallizing said barrier metal layer with CVD copper.

9. A method of enhancing copper adhesion to a substrate comprising:

preparing a single-crystal silicon substrate;

forming a barrier metal layer over the substrate;

forming integrated circuit components on active areas of the substrate;

metallizing the integrated circuit components, including:

in a CVD process chamber, depositing copper in the chamber by CVD utilizing a liquid copper precursor having a liquid precursor flow rate of about 0.05 cm$^3$ min$^{-1}$ for about 30 seconds to form a first copper layer on the integrated circuit components; and after the first copper layer is formed, depositing copper in the chamber by CVD utilizing a liquid copper precursor having a liquid precursor flow rate of about 1.5 cm$^3$ min$^{-1}$ until a second copper layer having a thickness of between about 200 nm and 1,500 nm is formed on the integrated circuit components.

10. The method of claim 9 wherein said first copper layer has a thickness of between about 1 nm to 100 nm.

* * * * *